United States Patent [19]

Konno et al.

[11] 4,093,577

[45] June 6, 1978

[54] PHOTOCURABLE RESIN COMPOSITIONS

[75] Inventors: Ryozo Konno; Akira Ikeda; Toshimitsu Ugai; Akio Hirose, all of Tokyo, Japan

[73] Assignee: Toyo Ink Manufacturing Co., Ltd., Tokyo, Japan

[21] Appl. No.: 773,650

[22] Filed: Mar. 2, 1977

[30] Foreign Application Priority Data

Mar. 5, 1976 Japan ............................ 51-23108
Mar. 9, 1976 Japan ............................ 51-24697
Mar. 9, 1976 Japan ............................ 51-24698

[51] Int. Cl.² ................... C09D 3/64; C09D 5/32; C09D 11/10
[52] U.S. Cl. .................. 260/22 CB; 204/159.15; 204/159.19
[58] Field of Search ............ 260/22 CB, 75 N, 78 R; 204/159.15, 159.19; 260/861, 873

[56] References Cited

U.S. PATENT DOCUMENTS

| | | | |
|---|---|---|---|
| 3,558,387 | 1/1971 | Bassemir et al. | 204/159.15 |
| 3,894,978 | 7/1975 | Montesissa et al. | 260/22 CB |
| 3,945,833 | 3/1976 | Sumith et al. | 204/159.15 |
| 4,008,138 | 2/1977 | Rosen et al. | 204/159.15 |

*Primary Examiner*—Ronald W. Griffin
*Attorney, Agent, or Firm*—Frank J. Jordan

[57] ABSTRACT

A photocurable resin composition comprising a photopolymerizable photosensitizing compound (A) together with or without a photopolymerizable photosensitizing compound (B), the compound (A) being prepared by esterifying with acrylic or methacrylic acid or the like a resin having an OH equivalent of 150 – 500 produced by esterification of a dialkylaminobenzoic acid, a polybasic acid or, if desired, a fatty acid having at least 9 carbon atoms, with a polyhydric alcohol, and the compound (B) being prepared by repeating the aforesaid process for preparing the compound (A) except that a carboxyl group-containing benzophenone derivative is substituted for the dialkylaminobenzoic acid.

17 Claims, No Drawings

PHOTOCURABLE RESIN COMPOSITIONS

This invention relates to a photocurable resin composition and more particularly to a photocurable resin composition containing a so-called built-in type photopolymerizable photosensitizing compound.

There have heretofore been made numerous research studies on photocurable resin compositions because such compositions are advantageous in that they are rapidly curable and require no solvents. The rapid curability is owed largely to the photocurability of the resin composition itself as well as to the action of the built-in photosensitizing agent contained therein.

There have heretofore been proposed a variety of photosensitizing compounds. More of them are, however, low molecular weight compounds and they do not participate in chemical reactions, such as crosslinking and polymerization, with film-forming resins. Since these photosensitizing compounds are added in large amounts to the compositions to meet the required speed of curing, they are not wholly consumed during a brief duration of ultraviolet ray irradiation and partly remain in the cured film. This raises problems as to precipitation of the compounds and elution thereof with solvents from the cured film and also as to degradation of the compounds in properties. These problems have been the ones to be further solved.

In order to solve these problems the present inventors earlier made an invention relating to a built-in type photopolymerizable photosensitizing compound which is obtainable by reacting an unsaturated fatty acid such as a diakylaminobenzoic acid or acrylic acid, with a polyepoxy compound (Japanese Patent Application No. 148703/74). However, the polyepoxy compounds were disadvantageous in that they were not only expensive but also somewhat unsatisfactorily photopolymerizable because of limitations in number of the functional double bonds introduced per the molecular weight of the photosensitizing compound due to the larger molecular weight of the epoxy group introduced.

Studies were made by the present inventors in an attempt to solve the aforementioned problems and, as a result of the studies, it has been found that various polyhydric alcohols, particularly at least trihydric alcohols, may be esterified with polybasic acids to produce a resin having a desired OH equivalent. The properties of the resin so produced may then be esterified with a dialkylaminobenzoic acid and an ethylenically unsaturated fatty acid to obtain a photopolymerizable photosensitizing compound which is satisfactory in both photopolymerizability and photosensitivity.

More specifically, the object of this invention is to provide a photocurable resin composition comprising (A) photopolymerizable photosensitizing compounds obtained by esterification of an ethylenically unsaturated fatty acid such as acrylic acid or methacrylic acid with a resin having an OH eqivalent of 150 – 500 obtained by esterifying, by the use of a usual method, a polyhydric alcohol with a dialkylaminobenzoic acid, polybasic acid and, if necessary, a fatty acid containing 9 or more carbon atoms and a carboxyl group-containing benzophenone derivative, or (B) a photopolymerizable photosensitizing compound obtained by esterification of acrylic or methacrylic acid with a resin having an OH equivalent of 150 – 500 produced by esterification, in a usual manner, of a polyhydric alcohol with the photosensitizing compound (A), the carboxyl group-containing benzophenone derivative, the polybasic acid and, if necessary, the fatty acid having at least 9 carbon atoms.

Dialkylaminobenzoic acids to be used in this invention are those having alkyl groups containing 5 or less carbon atoms such as dimethylaminobenzoic acid, diethylaminobenzoic acid and dipropylaminobenzoic acid and their substitution products. Needless to say, their methyl or ethyl esters may be used in the practice of this invention.

The carboxyl group-containing benzophenone derivatives used in this invention include benzoylbenzoic acid, chlorobenzoylbezoic acid, methylbenzoylbenzoic acid, methoxybenzoylbenzoic acid and benzophenonetetracarboxylic dianhydride. Their methyl or ethyl esters may also be used as in the afore-stated case of using the esters of dialkylaminobenzoic acids. The polybasic acids usable in this invention include phthalic anhydride, isophthalic acid, adipic acid and trimellitic acid.

The polyhydric alcohols to be used in this invention are, e.g., ethylene glycol, diethylene glycol, triethylene glycol, tetramethylene glycol, trimethylolpropane, pentaerythritol and dipentaerythritol. The fatty acids containing 9 or more carbon atoms to be used include lauric acid, palmitic acid, stearic acid, tung oil fatty acid and, linseed fatty acid. The selection is made according to the flexibility, compatibility with the other ingredients and other specific properties required in the resulting coating.

Dialkylaminobenzoic acids, polybasic acids, polyhydric aocohols and, if necessary, fatty acids with 9 or more carbon atoms are esterified with one another usually at temperatures between 150° and 230° C in the presence of an acid catalyst in such respective amounts that the resin to be obtained may have an OH equivalent of 150 – 500.

The esterification of these acids and alcohols may be performed at the same time or in two steps comprising firstly esterifying the polyhydric alcohols with the polybasic acids and then with the dialkylaminobenzoic acids.

When the benzophenone derivatives containing at least one carboxyl group are used, the esterification may be performed in the same way.

The esterification of the said resin having the OH equivalent of 150 – 500 with the unsaturated fatty acids is performed at comparatively low temperatures of 70° – 130° C in the presence or absence of a thermal polymerization inhibitor while inhibiting thermal polimerization of the unsaturated groups. The unsaturated fatty acids to be used may be acrylic acid, methacrylic acid, crotonic acid and the like.

The use of a resin having an OH equivalent of less than 150 is not recommendable because of its unsatisfactory compatibility with the other ingredients, while the use of a resin having an OH equivalent of over 500 will result in the production of a product resin having an inadequately small number of reactive double bonds per molecule.

The photopolymerizable photosensitizing compound used in this invention together with other photopolymerizable monomers and/or prepolymers constitutes the essential components of the photocurable resin composition and is photocurable at a practically acceptable curing rate. In a case where a more rapid curing rate is required, other heretofore known photosensitizers may be added to the photosensitizing compound according to this invention. Hitherto known sensitizers are, e.g., benzoin, benzoinalkyl ether, decyl chloride, decyl bromide, acetophenone, benzophenone, benzil, N, N'-tetraalkylbenzophenones and azobisisobutylonitrile.

The photocurable resin composition of this invention further comprises as an essential component a photopolymerizable monomer and/or prepolymer. The monomers include styrene, styrene derivatives, methyl (meth)acrylate, ethyl (meth)acrylate, butyl (meth)acrylate, 2-ethylhexyl (meth)acrylate, ethylene glycol di(meth)acrylate, 1, 3-butanediol di(meth)acrylate, trimethylolpropane tri(meth)acrylate and pentaerythritol tri(meth)acrylate. The prepolymers include unsaturated polyesters and the adduct of epoxy compounds with acrylic or methacrylic acid. To the photopolymerizable resin composition may also be added a coloring matter, a filler and the like depending upon the purposes for which the resin composition is used.

In the present invention the photopolymerizable photosensitizing compounds may be used in amounts of 1 - 90%, preferably 10 - 70%, by weight of the photopolymerizable resin composition.

In cases where both the (A) and (B) photosensitizing compounds are used, the (A) : (B) ratio is preferably in the range of about 3 : 1 to 1 : 20, and they may be used jointly in amounts of 1 - 90%, preferably 10 - 70% by weight of the resin composition.

The photopolymerizable resin composition of the present invention, when used as a paint or a printing ink, will exhibit superior characteristics including rapid curability and good properties of films obtained therefrom, without precipitation and elution of the photosensitizers from the films as is often the case with conventional compositions.

This invention will be further detailed with reference to the following examples wherein all parts are by weight unless otherwise specified.

EXAMPLE 1

In a four-necked flask provided with a thermometer, a water separator, an inlet for a gas and a stirrer, 165 parts of p-dimethylaminobenzoic acid, 74 parts of phthalic anhydride and 134 parts of trimethylolpropane were reacted together in a stream of carbonic acid gas at 230° C for 4 hours, thus yielding an ester having an acid value of 5 or less and a hydroxyl group equivalent of about 300.

To this system, after it was cooled, were added 60 parts of benzene, 1.5 parts of p-toluenesulphonic acid and 0.3 parts of hydroquinone to form a mixture which was heated to 80° C in an air stream and incorporated dropwise with 70 parts of acrylic acid. After the end of the incorporation, the reaction system was raised to 110° - 120° C for 30 hours while controlling the reaction temperature thereby to obtain a photopolymerizable photosensitizing compound having an acid value of 15.

A mixture of 60 parts of this photosensitizing compound and 40 parts of trimethylolpropane triacrylate was coated on a steel plate to a thickness of 50μ and irradiated by a 2-KW high pressure mercury lamp at a distance of 15 cm, thereby curing the thus-coated mixture in 20 seconds.

EXAMPLE 2

To a four-necked flask provided with a thermometer, a water separator, an inlet for gases and a stirrer were added 82.5 parts of p-dimethylaminobenzoic acid, 140 parts of linseed oil fatty acid, 148 parts of phthalic anhydride and 202 parts of trimethylolpropane. The resulting mixture was subjected to reaction at 230° C for 5 hours in a stream of carbonic acid gas to yield an ester having an acid value not exceeding 5 and a hydroxyl group equivalent of 357. The system, after cooling, was incorporated with 110 parts of benzene, 2.5 parts of p-toluenesulphonic acid and 0.5 parts of hydroquinone. The resulting mixture was heated to 80° C with air continuously blown therein and incorporated dropwise with 97 parts of acrylic acid. The reaction system was then gradually raised in temperature while controlling the reaction temperature and kept in the range of 110° - 120° C. After 35 hours' reaction there was yielded a photopolymerizable photosensitizing compound having an acid value of 20.

A mixture of 60 parts of the compound so yielded and 40 parts of 1,6-hexanediol diacrylate was coated on a steel plate to a thickness of 50μ and irradiated by a 2-KW high-pressure mercury lamp at a distance of 15 cm thereby to cure the thus-formed coating in 25 seconds.

COMPARATIVE EXAMPLE 1

A reactor similar to that used in Example 2 was charged with 140 parts of linseed oil fatty acid, 148 parts of phthalic anhydride and 202 parts of trimethylolpropane, to form a mixture which was reacted at 280° C for 3 hours in a stream of carbonic acid gas, thus yielding an ester having an acid value of not more than 5 and a hydroxyl group equivalent of 231.

The system, after being cooled, was incorporated with 110 parts of benzene, 2.5 parts of p-toluenesulphonic acid and 0.5 parts of hydroquinone. The resulting mixture was heated to 80° C with air continuously blown therein and incorporated dropwise with 129 parts of acrylic acid, after which the reaction system was raised gradually to and maintained at 110° - 120° C. After 20 hours of the reaction there was yielded a prepolymer having an acid value of 15.

A mixture of 70 parts of the preolymer so yielded and 30 parts of 1,6-hexanediol diacrylate was coated on a steel plate and irradiated by a mercury lamp in the same manner as in Example 1, but the coating failed to cure in a long as 2 minutes.

EXAMPLE 3

A ractor similar to that used in Example 1 was charged with 82.5 parts of p-dimethylaminobenzoic acid, 280 parts of soybean oil fatty acid, 73 parts of adipic acid, 136 parts of pentaerythritol, 97 parts of acrylic acid, 2.5 parts of p-toluenesulphonic acid and 0.5 parts of hydroquinone. The resulting mixture was treated in the same way as in Example 1 to yield a photopolymerizable photosensitizing compound having an acid value of 25.

A mixture of 60 parts of the compound so yielded and 40 parts of ethylene glycol diacrylate was coated on a steel plate and irradiated in the same way as in Example 2; the coating cured in 30 seconds.

EXAMPLE 4

A mixture of 60 parts of the same photopolymerizable photosensitizing compound as used in Example 2, 40 parts of 1,6-hexanediol diacrylate and 5 parts of each of the photosensitizing agents given in Table 1 was coated on a steel plate and irradiated in the same way as in Example 1. The times needed for curing the coatings are given in Table 1. For comparison, the prepolymer obtained in Comparative example 1 was treated in the same manner as above and the curing times for the prepolymer coatings were obtained as shown in Table 1.

Table 1

| Photosensitizing additives | Prepolymer obtained in Example 2 | Prepolymer obtained in Comparative example 1 |
| --- | --- | --- |
| Benzophenone | 1 sec. | 30 sec. |
| Benzil | 2 sec. | 20 sec. |
| Acetophenone | 5 sec. | 40 sec. |
| Benzoinethyl ether | 1 sec. | 5 sec. |

EXAMPLE 5

| Mixture(1) | |
| --- | --- |
| Photopolymerizable photosensitizing compound obtained in Example 2 | 30 parts |
| Prepolymer obtained in Comparative example 1 | 30 parts |
| 1,6-hexanediol diacrylate | 40 parts |
| Mixture(2) | |
| Photopolymerizable photosensitizing compound obtained in Example 3 | 30 parts |
| Prepolymer used obtained in Comparative example 1 | 30 parts |
| Ethylene glycol diacrylate | 40 parts |

These two kinds of mixtures were separately subjected to the same steel plate coating and irradiation test as done in Example 1 with the result that the mixtures (1) and (2) cured in 30 seconds and 40 seconds, respectively.

EXAMPLE 6

| Photopolymerizable photosensitizing compound obtained in Example 2 | 60 parts |
| --- | --- |
| Each of the monomers listed in Table 2 | 40 parts |
| Benzophenone | 5 parts |

Mixtures of the above-listed components were coated and irradiated in the same way as in Example 2. They cured in the times given in Table 2, respectively.

Table 2

| Monomers used | curing time (seconds) |
| --- | --- |
| Styrene | 3 |
| Butyl acrylate | 1 |
| Butyl methacrylate | 2 |
| 1,6-hexanediol diacrylate | 1 |
| Trimethylolpropane triacrylate | 2 |
| Pentaerythritol | 2 |

EXAMPLE 7

A four-necked flask provided with a thermometer, a water separator, an inlet for gases and a stirrer was charged with 41 parts of p-dimethylaminobenzoic acid, 56 parts of o-benzoylbenzoic acid, 280 parts of soybean oil fatty acid, 74 parts of phthalic anhydride and 136 parts of pentaerythritol to form a mixture which was reacted at 230° C in a stream of carbonic acid gas for 5 hours to yield a resin having an acid value of 5 or less and an OH equivalent of about 300. The resin so yielded was then incorporated with 100 parts of benzene, 2.0 parts of p-toluenesulphonic acid and 0.3 parts of hydroquinone, heated to 80° C while blowing air thereinto, and incorporated dropwise with 97 parts of acrylic acid, after which the reaction mixture was raised in temperature solwly while inhibiting abrupt heat generation from occurring and maintained at 110° – 120° C. After 35 hours of the reaction the benzene was distilled off from the reaction mixture to obtain a photopolymerizable photosensitizing compound (A).

A mixture of 60 parts of this compound (A) and 40 parts of ethylene glycol diacrylate was coated and irradiated in the same way as done in Example 1 with the result that the mixture so coated cured in 2 seconds and formed a hard film.

EXAMPLE 8

In this Example, following the procedure of Example 7, but substituting 48 parts of p-diethylaminobenzoic acid and 115 parts of methacrylic acid respectively for the 41 parts of p-dimethylaminobenzoic acid and the 97 parts of acrylic acid, a photopolymerizable photosensitizing compound (A) was obtained. The compound (A) was tested in the same manner as in Example 7 and found to form a rigid film by curing in 3 seconds.

EXAMPLE 9

One hundred and forty parts of linseed oil fatty acid, 148 parts of phthalic anhydride, 202 parts of trimethylolpropane and 129 parts of acrylic acid, were esterified in the same way as in Example 7 thereby obtaining a prepolymer.

A mixture of 30 parts of the prepolymer so obtained, 30 parts of the compound (A) obtained in Example 7 and 40 parts of trimethylolpropane triacrylate was subjected to a curing test under the same conditions as in Example 1 with the result that it cured in 5 seconds.

COMPARATIVE EXAMPLE 2

A mixture of 60 parts of the prepolymer obtained in Example 9, 40 parts of trimethylolpropane triacrylate and 3 parts of benzoin ethyl ether was tested by the same method as empolyed in Example 1 with the result that the resulting film took 10 seconds to cure and the cured film had inferior properties.

EXAMPLE 10

A mixture of 30 parts of the photopolymerizable photosensitizing compound (A) obtained in Example 7, 30 parts of the prepolymer obtained in Example 9 and 40 parts of each of the monomers listed in Table 3 was coated on a steel plate and irradiated by ultraviolet rays in the same manner as done in Example 1. The film curing times obtained are indicated in Table 3.

Table 3

| Monomers used | Curing time (seconds) |
| --- | --- |
| Styrene | 4 |
| Butyl acrylate | 2 |
| Butyl methacrylate | 2 |
| Ethylene glycol diacrylate | 2 |
| Ethylene glycol dimethacrylate | 4 |
| Trimethylolpropane triacrylate | 2 |
| Trimethylolpropane trimethacrylate | 4 |
| Pentaerythritol triacrylate | 2 |

EXAMPLE 11

This Example used two kinds of photopolymerizable photosensitizing compound. One was the same compound as obtained in Example 2, that is, the photosensitizing compound (A). The other was a photopolymerizable photosensitizing compound (B) having an acid value of 12 obtained by reacting together, in a reactor similar to that used for production of the compound (A), 113 parts of o-benzoylbenzoic acid, 140 parts of linseed oil fatty acid, 148 parts of phthalic anhydride, 202 parts of trimethylolpropane and 97 parts of acrylic acid in the presence of 110 parts of benzene as a refluxing solvent, 2.5 parts of p-toluenesulphonic acid as a catalyst and 0.5 parts of hydroquinone as a polymerization inhibitor.

A mixture of 30 parts of the compound (A), 30 parts of the compound (B) and 40 parts of 1,6-hexanediol diacrylate was coated on a steel plate and irradiated in the same manner as in Example 1 with the result that the resulting coating cured in 2 seconds.

For comparison, a mixture of 60 parts of the compound (A) and 40 parts of 1,6-hexanediol diacrylate, and a mixture of 60 parts of the compound (B) and 40 parts of 1,6-hexanediol diacrylate were subjected to the same curing test as above and found to cure in 25 and 20 seconds, respectively.

EXAMPLE 12

In the same manner as in Example 11, 140 parts of linseed oil fatty acid, 148 parts of phthalic anhydride, 202 parts of trimethylolpropane and 159 parts of acrylic acid were reacted together using benzene as a refluxing solvent in the presence of p-toluenesulphonic acid and hydroquinone to yield a prepolymer.

A mixture of 30 parts of the prepolymer so yielded, 15 parts each of the same photopolymerizable photosensitizing compounds (A) and (B) as used in Example 11 and 40 parts of trimethylolpropane triacrylate was coated on a steel plate and irradiated in the same manner as in Example 1 with the result that the resulting coating cured in 5 seconds.

For comparison, a mixture of 60 parts of the said prepolymer and 40 parts of trimethylolpropane triacrylate was incorporated with 3 parts of benzoin ethyl ether as a photosensitizing agent for photopolymerization to form a coating material which was coated on a steel plate and irradiated by ultraviolet rays. The resulting coating took 10 seconds to cure and the cured coating had inferior properties.

EXAMPLE 13

Mixtures each consisting of 30 parts of each of the same photopolymerizable photosensitizing compounds (A) and (B) as used in Example 11 and 40 parts of a member selected from the group of monomers listed in Table 4 were coated respectively on steel plates and irradiated by ultraviolet rays in the same manner as in Example 1. The coating curing time for each mixture is shown in the same Table.

Table 4

| Monomers used | Time for curing coating(seconds) |
| --- | --- |
| Styrene | 5 |
| Butyl acrylate | 2 |
| Butyl methacrylate | 3 |
| Ethylene glycol diacrylate | 2 |
| Ethylene glycol dimethacrylate | 5 |
| Trimethylolpropane triacrylate | 3 |
| Trimethylolpropane trimethacrylate | 5 |
| Pentaerythritol triacrylate | 3 |

What is claimed is:

1. A photocurable resin composition comprising (1) 1 to 90% by weight of a photopolymerizable photosensitizing compound prepared by esterifying with an ethylenically unsaturated fatty acid a resin having an OH equivalent of 150 – 500 produced by esterification of a dialkylaminobenzoic acid and a polybasic acid with a polyhydric alcohol, (2) 99 to 5.2% by weight of a photopolymerizable monomer and (3) 0 to 4.8% by weight of a photosensitizing agent, the percentages being based on the weight of said resin composition.

2. A photocurable resin composition according to claim 1, wherein a fatty acid having at least 9 carbon atoms is further used in the esterification for the production of said resin.

3. A photocurable resin composition according to claim 2, wherein the fatty acid having at least 9 carbon atoms is a member selected from the group consisting of lauric acid, palmitic acid, stearic acid, tung oil fatty acid, soybean oil fatty acid and linseed oil fatty acid.

4. A photocurable resin composition according to claim 1, wherein the ethylenically unsaturated fatty acid is a member selected from the group consisting of acrylic acid, methacrylic acid and crotonic acid.

5. A photocurable resin composition according to claim 4, wherein the alkyl groups of the dialkylaminobenzoic acid are ones having not more than 5 carbon atoms, the polybasic acid is a member selected from the group consisting of phthalic anhydride, isophthalic anhydride, adipic acid and trimellitic acid and the polyhydric alcohol is a member selected from the group consisting of ethylene glycol, diethylene glycol, triethylene glycol, tetramethylene glycol, and trimethylolethane, trimethylolpropane, pentaerithritol and dipentaerithritol.

6. A photocurable resin composition comprising components (1) 1 to 90% by weight of a photopolymerizable photosensitizing compound prepared by esterifying with an ethylenically unsaturated fatty acid a resin having an OH equivalent of 150 – 500 produced by esterification of a dialkylaminobenzoic acid, a carboxyl group-containing benzophenone derivative selected from the group consisting of benzoylbenzoic acid, chlorobenzoylbenzoic acid, methylbenzoylbenzoic acid, methoxybenzoylbenzoic acid, benzophenonetetracarboxylic dianhydride, and methyl and ethyl esters thereof, and a polybasic acid with a polyhydric alcohol, (2) 99 to 5.2% by weight of a photopolymerizable monomer and (3) 0 to 4.8% by weight of a photosensitizing agent, the percentages being based on the weight of said resin composition.

7. A photocurable resin composition according to claim 6, wherein a fatty acid having at least 9 carbon atoms is further used in the esterification for the production of said resin.

8. A photopolymerizable resin composition according to claim 7, wherein the fatty acid having at least 9 carbon atoms is a member selected from the group consisting of lauric acid, palmitic acid, stearic acid, tung oil fatty acid, soybean oil fatty acid and linseed oil fatty acid.

9. A photocurable resin composition according to claim 6, wherein the ethylenically unsaturated fatty acid is a member selected from the group consisting of acrylic acid, methacrylic acid and crotonic acid.

10. A photocurable resin composition according to claim 9, wherein the alkyl groups of the dialkylaminobenzoic acid are ones having not more than 5 carbon atoms, the polybasic acid is a member selected from the group consisting of phthalic anhydride, isophthalic anhydride, adipic acid and trimellitic acid and the polyhydric alcohol is a member selected from the group consisting of ethylene glycol, diethylene glycol, triethylene glycol, tetramethylene glycol, trimethylolethane, trimethylolpropane, pentaerithritol and dipentaerithritol.

11. A photocurable resin composition according to claim 6, wherein said component (1) also includes an unsaturated polyester prepared by esterifying an ethylenically unsaturated fatty acid, a polybasic acid, and a fatty acid having at least 9 carbon atoms with a polyhydric alcohol.

12. A photocurable resin composition comprising a photopolymerizable photosensitizing compound (A) prepared by esterifying with an ethylenically unsaturated fatty acid a resin having an OH equivalent of 150 – 500 produced by esterification of a dialkylaminobenzoic acid and a polybasic acid with a polyhydric alcohol, and a photopolymerizable photosensitizing compound (B) prepared by esterifying with an ethylenically unsaturated fatty acid a resin having an OH equivalent of 150 – 500 produced by esterification of a carboxyl group-containing benzophenone derivative selected from the group consisting of benzoylbenzoic acid, chlorobenzoylbenzoic acid, methylbenzoylbenzoic acid, methoxybenzoylbenzoic acid and benzophenonetetracarboxylic dianhydride, and a polybasic acid with a polyhydric alcohol.

13. A photocurable resin composition according to claim 12, wherein a fatty acid having at least 9 carbon atoms is further used in the esterification for producing said resin for use in the preparation of each of the compounds (A) and (B).

14. A photocurable resin composition according to claim 12, wherein the ethylenically unsaturated fatty acid is a member selected from the group consisting of acrylic acid, methacrylic acid and crotonic acid.

15. A photocurable resin composition according to claim 14, wherein the alkyl groups of the dialkylaminobenzoic acid are ones having not more than 5 carbon atoms, the polybasic acid is a member selected from the group consisting of phthalic anhydride, isophthalic anhydride, adipic acid and trimellitic acid and the polyhydric alcohol is a member selected from the group consisting of ethylene glycol, diethylene glycol, triethylene glycol, tetramethylene glycol, trimethylolethane, trimethylolpropane, pentaerithritol and dipentaerithritol.

16. A photocurable resin composition according to claim 12, wherein said composition also includes an unsaturated polyester prepared by esterifying an ethylenically unsaturated fatty acid, a polybasic acid, and a fatty acid having at least 9 carbon atoms with a polyhydric alcohol.

17. A photocurable resin composition comprising a photopolymerizable photosensitizing compound (A) prepared by esterifying with an ethylenically unsaturated fatty acid a resin having an OH equivalent of 150–500 produced by esterification of a dialkylaminobenzoic acid and a polybasic acid with a polyhydric alcohol, and a photopolymerizable photosensitizing compound (B) prepared by esterifying with an ethylenically unsaturated fatty acid a resin having an OH equivalent of 150–500 produced by esterification of a carboxyl group-containing benzophenone derivate selected from the group consisting of benzoylbenzoic acid, chlorobenzoylbenzoic acid, methylbenzoylbenzoic acid, methoxybenzoylbenzoic acid and benzophenonetetracarboxylic dianhydride, and methyl and ethyl esters thereof, and a polybasic acid with a polyhydric alcohol.

* * * * *